(12) United States Patent
Pillarisetty et al.

(10) Patent No.: US 7,629,643 B2
(45) Date of Patent: Dec. 8, 2009

(54) INDEPENDENT N-TIPS FOR MULTI-GATE TRANSISTORS

(75) Inventors: Ravi Pillarisetty, Portland, OR (US);
Suman Datta, Port Matilda, PA (US);
Jack T. Kavalieros, Portland, OR (US);
Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 11/948,414

(22) Filed: Nov. 30, 2007

(65) Prior Publication Data

US 2009/0140341 A1    Jun. 4, 2009

(51) Int. Cl.
*H01L 27/108* (2006.01)

(52) U.S. Cl. .............. 257/327; 257/213; 257/328; 257/329; 257/365; 257/E39.02

(58) Field of Classification Search ............... 257/213, 257/327, 328, 329, 365, E39.02
See application file for complete search history.

(56) References Cited

U.S. PATENT DOCUMENTS

| | | | |
|---|---|---|---|
| 5,834,355 A | 11/1998 | Doyle | |
| 6,656,822 B2 | 12/2003 | Doyle et al. | |
| 6,858,478 B2 | 2/2005 | Chau et al. | |
| 6,914,295 B2 | 7/2005 | Chau et al. | |
| 6,952,040 B2 | 10/2005 | Chau et al. | |
| 6,970,373 B2 | 11/2005 | Chau et al. | |
| 7,005,366 B2 | 2/2006 | Chau et al. | |
| 7,042,009 B2 | 5/2006 | Shaheen et al. | |
| 7,071,064 B2 | 7/2006 | Doyle et al. | |
| 7,138,305 B2 | 11/2006 | Datta et al. | |
| 7,193,279 B2 | 3/2007 | Doyle et al. | |
| 7,512,017 B2 * | 3/2009 | Chang .................. 365/188 |
| 2007/0134878 A1 | 6/2007 | Brask et al. | |
| 2007/0145487 A1 | 6/2007 | Kavalieros et al. | |
| 2007/0148926 A1 | 6/2007 | Datta et al. | |
| 2007/0152266 A1 | 7/2007 | Doyle et al. | |
| 2007/0231984 A1 | 10/2007 | Metz et al. | |
| 2007/0231997 A1 | 10/2007 | Doyle et al. | |
| 2007/0238273 A1 | 10/2007 | Doyle et al. | |

OTHER PUBLICATIONS

Chau, Robert S., etal; High Mobility Tri-Gate Devices and Methods of Fabrication; filed Jan. 12, 2006; USPTO U.S. Appl. No. 11/332,189.

(Continued)

*Primary Examiner*—Tan N Tran
(74) *Attorney, Agent, or Firm*—Cool Patent, P.C.; Joseph P. Curtin

(57) ABSTRACT

Independent n-tips for multi-gate transistors are generally described. In one example, an apparatus includes a semiconductor fin, one or more multi-gate pull down (PD) devices coupled with the semiconductor fin, the one or more PD devices having an n-tip dopant concentration in the semiconductor fin material adjacent to the one or more PD devices, and one or more multi-gate pass gate (PG) devices coupled with the semiconductor fin, the one or more PG devices having an n-tip dopant concentration in the semiconductor fin material adjacent to the one or more PG devices, wherein the n-tip dopant concentration for the PG device is lower than the n-tip dopant concentration for the PD device.

7 Claims, 4 Drawing Sheets

OTHER PUBLICATIONS

Chui, Chi On., etal; Forming a Non-Planar Transistor Having a Quantum Well Channel; filed Mar. 27, 2007; USPTO U.S. Appl. No. 11/728,891.

Datta, Suman, etal; SRAM and Logic Transistors With Variable Height Multi-Gate Transistor Architecture; filed Dec. 29, 2006; USPTO U.S. Appl. No. 11/648,521.

Doyle, Brian S., etal; Methods for Uniform Doping of Non-Planar Transistor Structures; filed Sep. 29, 2006; USPTO U.S. Appl. No. 11/529,963.

Doyle, Brian S., etal; Multi-Gate Structure and Method of Doping Same; filed Mar. 28, 2007; USPTO U.S. Appl. No. 11/729,198.

Doyle, Brian S., etal; Substrate Band Gap Engineering in Multi-Gate PMOS Devices; filed Mar. 29, 2006; USPTO U.S. Appl. No. 11/393,168.

Doyle, Brian S., etal; Tri-Gate Devices and Methods of Fabrication; filed Aug. 23, 2002; USPTO U.S. Appl. No. 10/227,068.

Doyle, Brian S., etal; Tri-Gate Devices and Methods of Fabrication; filed Nov. 7, 2003; USPTO U.S. Appl. No. 10/703,316.

Hudait, Mantu K., etal; Forming Arsenide-Based Complementary Logic on a Single Substrate; filed Feb. 28, 2007; USPTO U.S. Appl. No. 11/712,191.

Hudait, Mantu K., etal; Improved Dopant Confinement in the Delta Doped Layer Using a Dopant Segregation Barrier in Quantum Well Structures; filed Dec. 29, 2006; USPTO U.S. Appl. No. 11/647,989.

Jin, Been Y., etal; Mechanism for Forming a Remote Delta Doping Layer of a Quantum Well Structure; filed Mar. 29, 2007; USPTO U.S. Appl. No. 11/731,266.

Kavalieros, Jack T., etal; An Apparatus and Method for Selectively Recessing Spacers on Multi-Gate Devices; filed Sep. 15, 2006; USPTO U.S. Appl. No. 11/521,624.

Rachmady, Willy, etal; Tri-Gate Device With Conformal PVD Workfunction Metal on its Three-Dimensional Body and Fabrication Method Thereof; filed May 3, 2006; USPTO U.S. Appl. No. 11/418,295.

\* cited by examiner a)

b)

c)

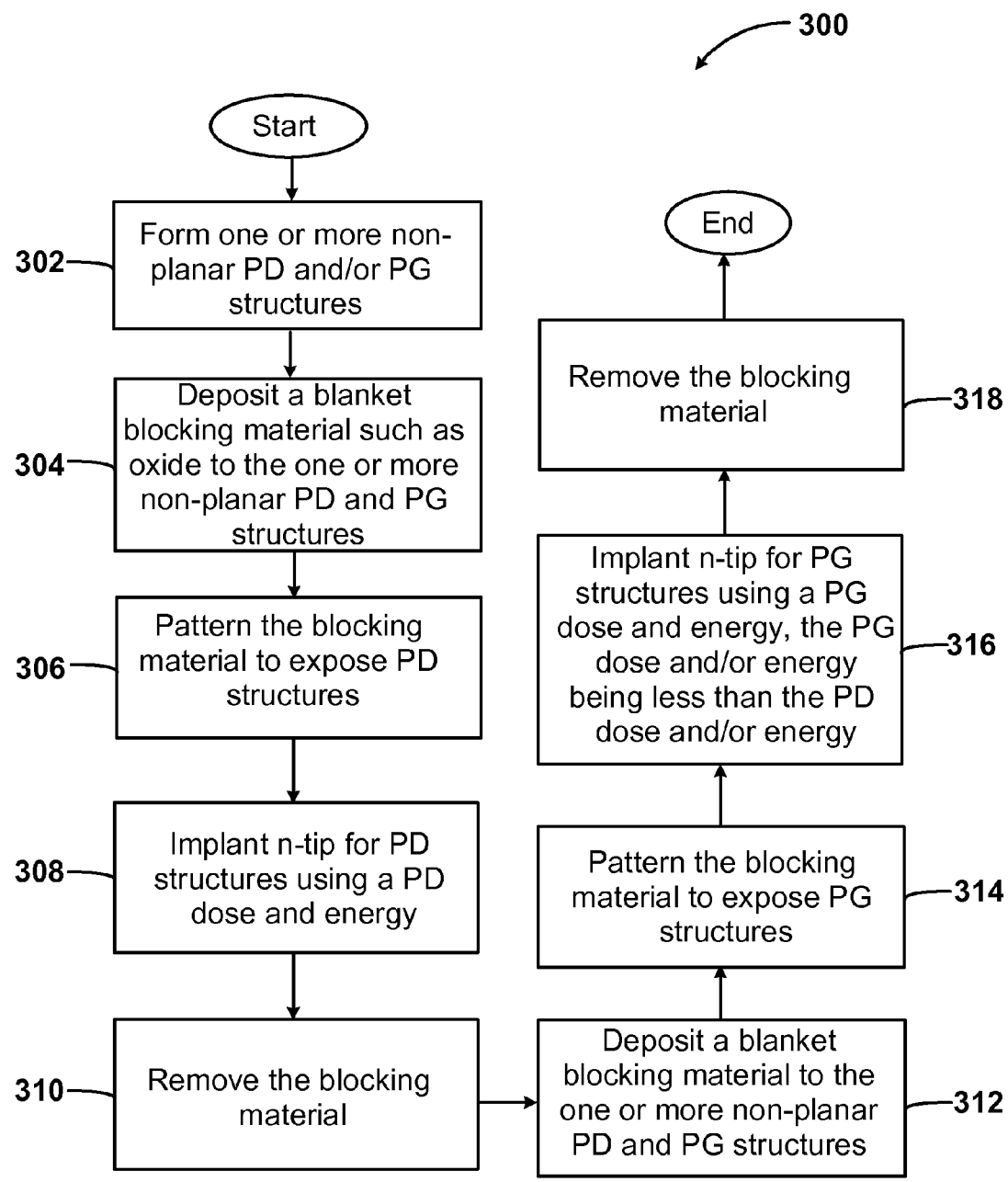

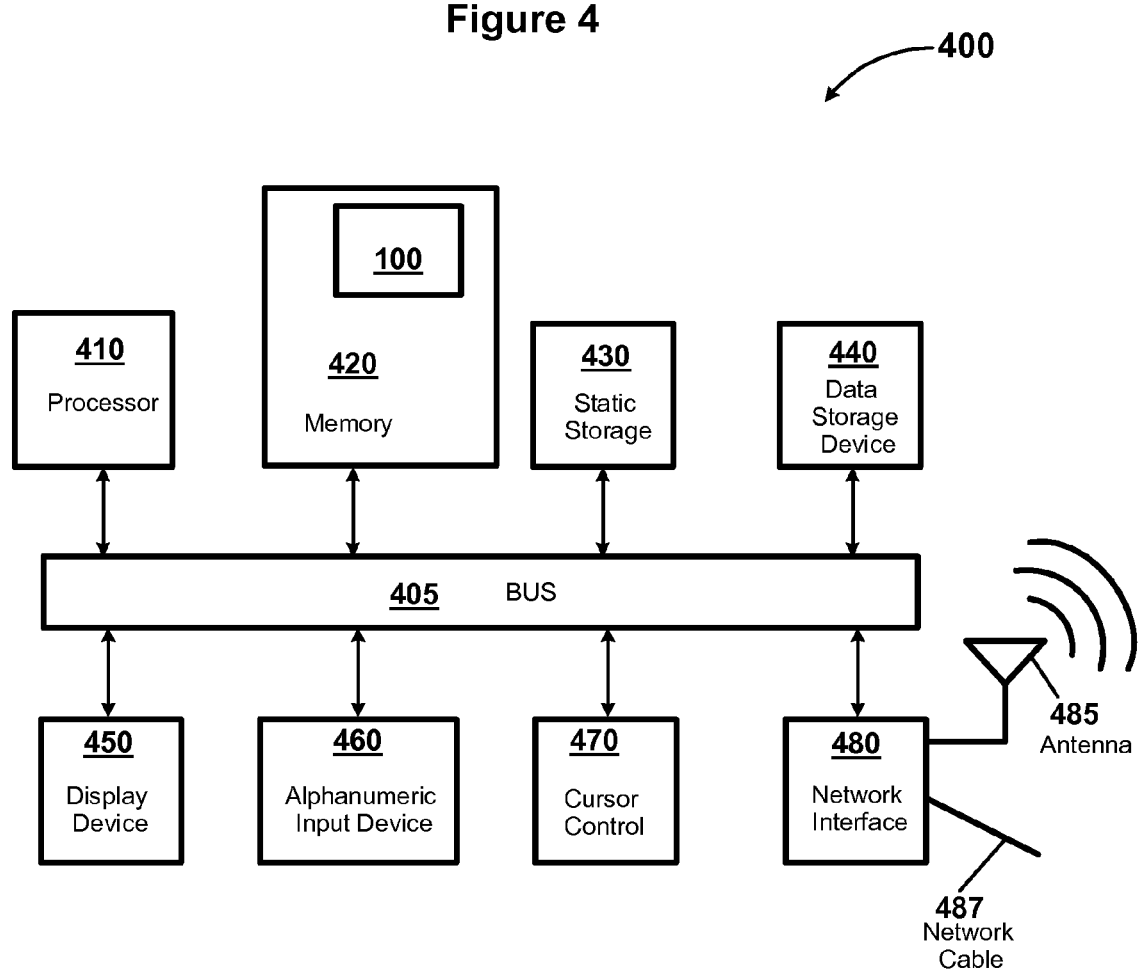

INDEPENDENT N-TIPS FOR MULTI-GATE TRANSISTORS

BACKGROUND

Generally, semiconductor devices such as static random access memory (SRAM) require sufficient static noise margin to maintain cell stability during read operations.

BRIEF DESCRIPTION OF THE DRAWINGS

Embodiments disclosed herein are illustrated by way of example, and not by way of limitation, in the figures of the accompanying drawings in which like reference numerals refer to lo similar elements and in which:

FIG. 3 is a flow diagram of a method for providing independent n-tips for multi-gate transistors, according to but one embodiment; and FIG. 4 is a diagram of an example system in which embodiments of the present invention may be used, according to but one embodiment.

Figure 1:
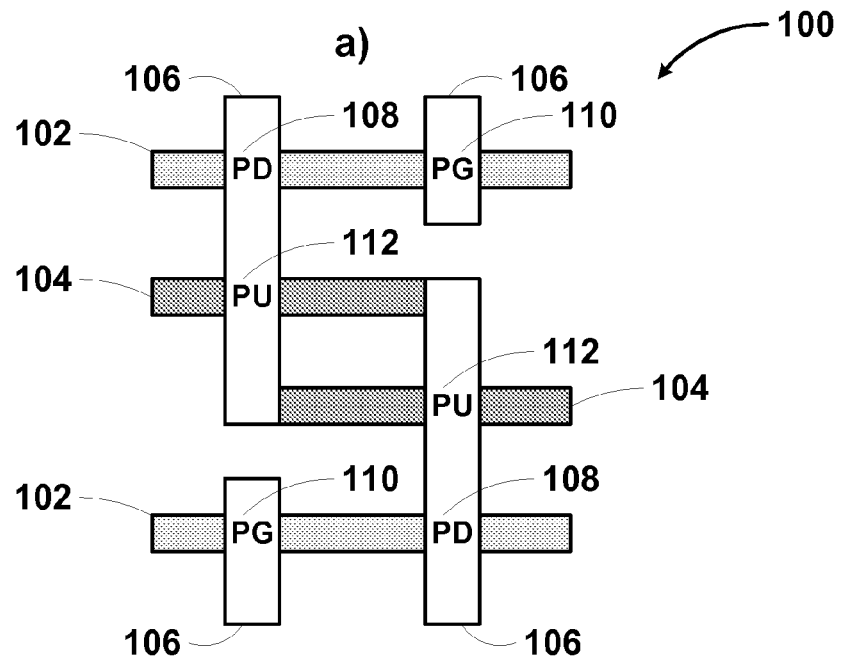
FIGS. 1a-1c provide a top-down view of independent n-tips for multi-gate transistors, according to but one embodiment.
Figure 1:
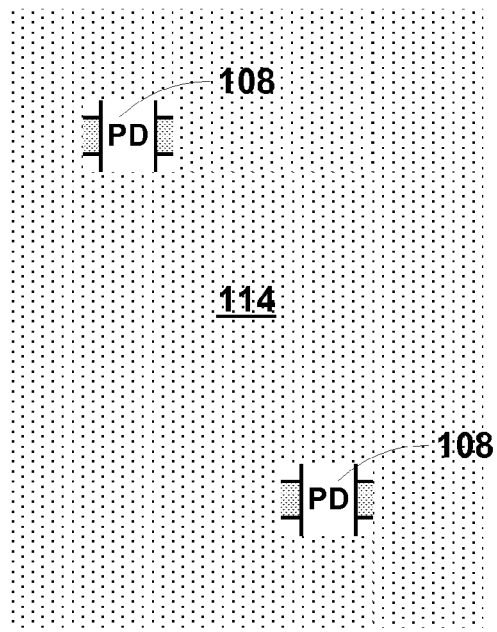
Figure 1:
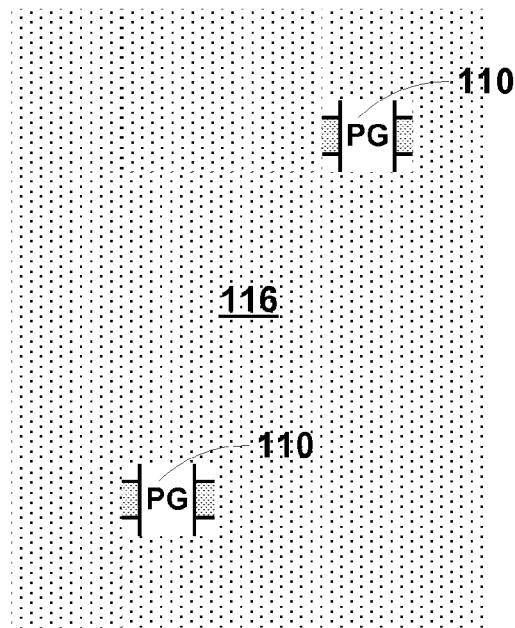

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of independent n-tips for multi-gate transistors are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIGS. 1a-1c provide a top-down view of independent n-tips for multi-gate transistors 100, according to but one embodiment. In an embodiment according to FIG. 1a, an apparatus 100 includes n-diffusion material 102, p-diffusion material 104, gate electrodes 106, pull down (PD) structures or devices 108, pass gate (PG) structures or devices 110, and pull up (PU) structures or devices 112, each coupled as shown. The particular design layout illustrated in FIG. 1a is merely one embodiment of many that fall within the scope and spirit of this description. Other embodiments include more or less transistor devices 108, 110, 112 and/or different arrangements, for example.

Non-planar transistors 108, 110, 112, such as tri-gate transistors, may generally provide exceptional short channel effect control, providing a viable option to support future technology scaling in the semiconductor industry. To enable the use of multi-gate non-planar transistors 108, 110, 112, an on-die memory cache may include tri-gate based six-transistor (6T) SRAM cells 100, according to but one embodiment. A tri-gate based SRAM cell 100 may require sufficient read stability to support array functionality. In an embodiment, SRAM cell read stability is dependent upon static noise margin (SNM), which is strongly dependent upon the conductivity ratio of the PD 108 to PG 110 transistor. This ratio may be called the beta (β) ratio as defined in equation (1) below, where $Z_{PD}$ is the total perimeter of the PD device, $L_{PD}$ is the actual gate length of the PD device, $Z_{PG}$ is the total perimeter of the PG device, and $L_{PG}$ is the actual gate length of the PG device:

$$\beta = (Z_{PD}/L_{PD})/(Z_{PG}/L_{PG}) \qquad (1)$$

For example, $Z_{PD}$ or $Z_{PG}$ may be twice the height of the semiconductor fin 102 plus the width of the fin in a u-shaped tri-gate device 108, 110 in an embodiment. In traditional 6T SRAM cells, based on planar transistors, the β ratio may be modulated using transistor sizing to achieve desired cell read stability. However, non-planar transistors 108, 110, 112 such as tri-gate transistors may not be amenable to biasing $Z_{PD}$, $L_{PD}$, $Z_{PG}$, or $L_{PG}$ relative to each other due to drastically different device physics in non-planar transistors. Modulating the p ratio in non-planar transistors 108, 110, 112 such as tri-gate may degrade cell performance and increase short channel effects, for example. In an embodiment, 6T SRAM cells based upon tri-gate transistors require similar sizing between PD 108 and PG 110 devices resulting in near unity or unity β ratio.

In an embodiment according to FIGS. 1b and 1c, independent n-tip implants are used for the PD 108 and PG 110 transistors to increase static noise margin and cell read stability. In an embodiment according to FIG. 1b, an implant blocking material 114 such as oxide, for example, is patterned to expose only the PD devices 108 for n-tip implant. In an embodiment according to FIG. 1c, an implant blocking material 116 such as oxide, for example, is patterned to expose only the PG devices 110 for n-tip implant. In one embodiment, the n-tip implant concentration for the PG device 110 is lower than the n-tip implant concentration for the PD device 108, resulting in an increase in the effective gate length of the PG device relative to the effective gate length of the PD device (the actual and effective gate length is described in more detail with respect to FIG. 2). Reduced n-tip implant concentration for the PG device 110 may increase the PD device 108 conductance relative to the conductance of the PG device 110, which in turn increases static noise margin and cell read stability.

In an embodiment, an apparatus 100 includes a semiconductor pillar or fin 102, one or more multi-gate PD devices 108 coupled with the semiconductor fin 102, the one or more PD devices 108 having an n-tip dopant concentration in the semiconductor fin 102 material adjacent to the one or more PD devices 108, and one or more multi-gate PG devices 110 coupled with the semiconductor fin, the one or more PG devices 110 having an n-tip dopant concentration in the semiconductor fin 102 material adjacent to the one or more PG devices 110, wherein the n-tip dopant concentration for the PG devices 110 is lower than the n-tip dopant concentration for the PD devices 108. A semiconductor fin 102 may be a protruding structure coupled with a semiconductor substrate (not shown). In an embodiment, a semiconductor pillar or fin 102 includes p-type material such as p-diffusion 102.

No particular order is required for the independent n-tip implants of the PD 108 and PG 110 devices. For example, the n-tip implant of the PG device 110 may occur prior to the n-tip implant of the PD device 108, and vice versa. In an embodiment, the n-tip dopant includes arsenic (As) for either the PG device 110 or the PD device 108, or for both devices 108, 110. The dose of the n-tip implant for the PD device 108 may be about $1\times10^{13}$ cm$^{-2}$ to $1\times10^{16}$ cm$^{-2}$ and the energy for the PD device 108 may be about 1 to 10 keV.

In an embodiment, the semiconductor fin 102 and the one or more PD 108 and PG 110 devices are part of a static random access memory (SRAM) cell having a β that is about equal to one. In another embodiment, the one or more PD devices 108 are tri-gate PD devices and the one or more PG devices 108 are tri-gate PG devices. The PD 108 and/or PG devices may be u-shaped tri-gate transistors. In an embodiment, the semiconductor fin 102 and the one or more PD 108 and PG 110 devices are part of a 6T cell, the 6T cell comprising two PD devices 108, two PG devices 110 and two pull-up (PU) devices 112.

Figure 2:
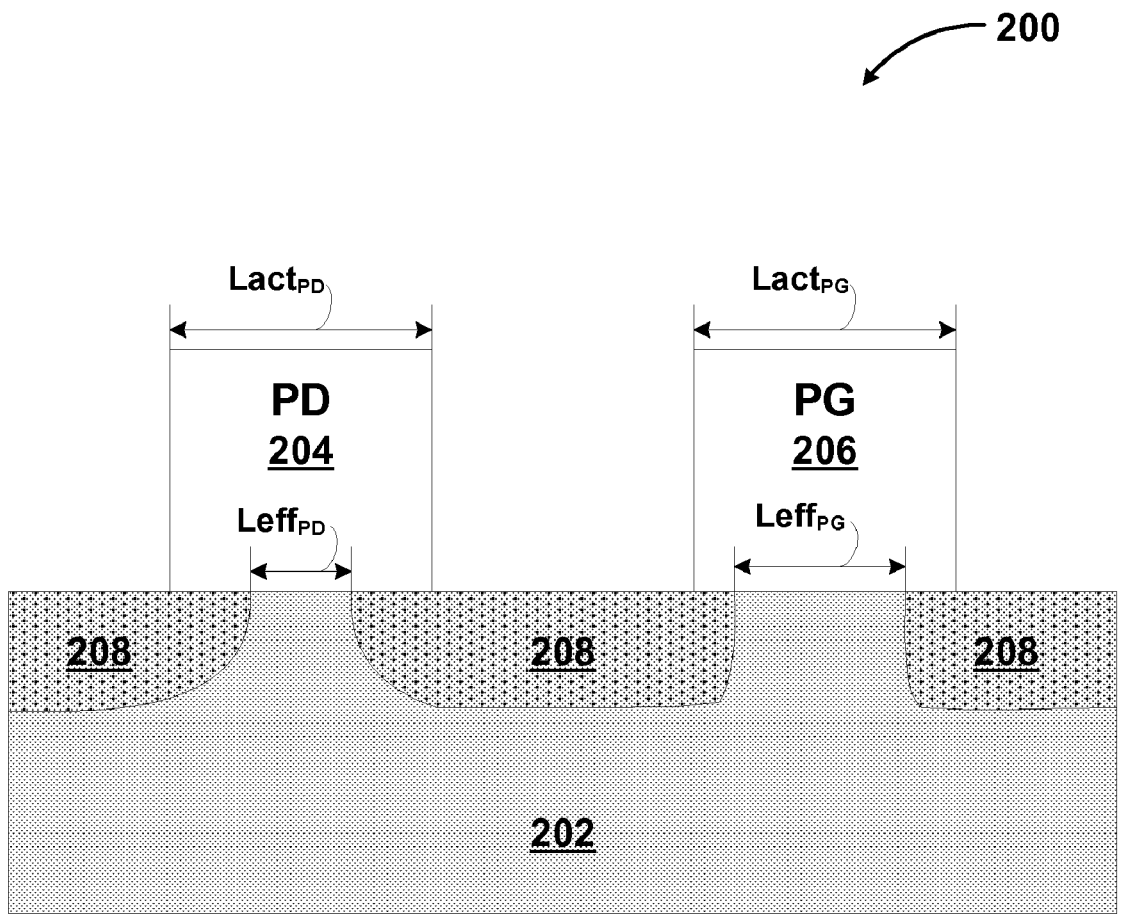
FIG. 2 is a cross-sectional side view of independent n-tips for multi-gate transistors, according to but one embodiment.

FIG. 2 is a cross-sectional side view of independent n-tips for multi-gate transistors 200, according to but one embodiment. In an embodiment, an apparatus 200 includes a semiconductor fin 202, a PD structure or device 204, a PG structure or device 206, and n-tip implant profile 208, each coupled as shown. A semiconductor fin 202 may include p-type material such as p-diffusion. The n-tip implant profile 208 may be a part of p-diffusion material 202 that is doped with n-tip implant such as As, for example. The implant concentration 208 may be reduced for the PG device 206 relative to the PD device 204 by decreasing either the implant dose or energy, or both, in an embodiment.

In an embodiment, a reduced energy or dose of the n-tip implant 208 for the PG device 206 relative to the PD device 204 increases the effective gate length, Leff$_{PG}$, of the PG device 206 relative to the effective gate length, Leff$_{PD}$, of the PD device 204. The effective gate lengths, Leff$_{PD}$ and Leff$_{PG}$, may be the distance between n-tip doped material 208 of semiconductor fin 202 adjacent to PD 204 and PG 206 structures, respectively. The actual gate lengths, Lact$_{Pd}$ and Lact$_{PG}$, of the PD 204 and PG 206 devices may be the distance across the actual gate material of the devices 204, 206 respectively. Effectively increasing the gate length of the transistor may provide the benefits associated with increasing gate length, without actually increasing gate length.

In other embodiments, apparatus 200 incorporates embodiments already described with respect to FIGS. 1a-1c.

FIG. 3 is a flow diagram of a method for providing independent n-tips for multi-gate transistors 300, according to but one embodiment. In an embodiment, a method 300 includes forming one or more non-planar PD and PG structures 302, depositing a blanket blocking material such as oxide to the one or more non-planar PD and PG structures 304, patterning the blocking material to expose PD structures 306, implanting n-tip for PD structures using a PD dose and energy 308, removing the blocking material 310, depositing a blanket blocking material to the one or more non-planar PD and PG structures 312, patterning the blocking material to expose PG structures 314, implanting n-tip for PG structures using a PG dose and energy, the PG dose and/or energy being less than the PD dose and/or energy 316, and removing the blocking material 318, with arrows providing but one suggested flow. A method 300 is not limited to the order depicted. For example, in another embodiment implanting n-tip for PG structures 316 and associated actions 314 are performed prior to implanting n-tip for PD structures 308 and associated actions 306.

In an embodiment, a method 300 includes forming one or more non-planar pass down (PD) structures 302, forming one or more non-planar pass gate (PG) structures 302, implanting n-tip for the one or more PD structures using a PD dose and energy 308, and implanting n-tip for the one or more PG structures using a PG dose and energy wherein the PG dose is less than the PD dose or wherein the PG energy is less than the PD energy 316, or suitable combinations thereof.

A method 300 may further include depositing an implant-blocking material to the one or more non-planar PD structures and to the one or more non-planar PG structures 304 and patterning the implant-blocking material to expose the one or more non-planar PD structures 306 prior to implanting n-tip for the one or more PD structures using a PD dose and energy 308. A method 300 may further include removing the implant-blocking material 310 after implanting n-tip for the one or more PD structures using a PD dose and energy.

In another embodiment, a method 300 includes depositing an implant-blocking material to the one or more non-planar PD structures and to the one or more non-planar PG structures 312 and patterning the implant-blocking material to expose the one or more non-planar PG structures prior to implanting n-tip for the one or more PG structures using a PG dose and energy 316. A method 300 may further include removing the implant-blocking material 318 after implanting n-tip for the one or more PG structures using a PG dose and energy 318.

In an embodiment, implanting n-tip for the one or more PD structures using a PD dose and energy 308 includes using a PD dose of about $1\times10^{13}$ cm$^{-2}$ to $1\times10^{16}$ cm$^{-2}$ and a PD energy of about 1 to 10 keV. In another embodiment, implanting n-tip for the one or more PG structures using a PG dose or energy that is less than the PD dose or energy 316 increases the effective gate length of the PG structure relative to the effective gate length of the PD structure to increase the static noise margin and read stability.

In one embodiment, forming one or more non-planar pass down (PD) structures 302 and forming one or more non-planar pass gate (PG) structures 302 includes at least gate patterning, defining the semiconductor fins, depositing gate material such as poly or high-k metal gate stack, and/or defining the gate material. In another embodiment, forming one or more non-planar pass down (PD) structures 302 and forming one or more non-planar pass gate (PG) structures 302 are part of forming a six-transistor static random access memory (SRAM) cell having a β that is about equal to one. Method 300 may incorporate embodiments already described with respect to FIGS. 1a-1c and FIG. 2.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

FIG. 4 is a diagram of an example system in which embodiments of the present invention may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes an apparatus having independent n-tips for multi-gate transistors 100 in accordance with embodiments described with respect to FIGS. 1-3. In an embodiment, an apparatus having independent n-tips for multi-gate transistors 100 as described herein is part of an electronic system's processor 410 or memory 420.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes an apparatus having independent n-tips for multi-gate transistors 100 in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes an apparatus having independent n-tips for multi-gate transistors 100 as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11 g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 400 includes one or more omnidirectional antennae 485, which may refer to an antenna that is at least partially omnidirectional and/or substantially omnidirectional, and a processor 410 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:
1. A semiconductor device, comprising:
a semiconductor fin comprising a semiconductor fin material;
at least one multi-gate pull down (PD) device connected directly to the semiconductor fin;
a first associated n-type dopant concentration tip region, which formed in the semiconductor fin material, is directly connected to the PD device; and
at least one multi-gate pass gate (PG) device connected directly to the semiconductor fin;
a second associated n-type dopant concentration tip region, which formed in the semiconductor fin material, is directly connected to the PG device;
wherein a second dopant concentration of the second n-type dopant concentration tip region is lower than a first dopant concentration of the first n-type dopant concentration tip region; and
wherein the first and second associated n-type dopant concentration tip regions are doped a same dopant;
wherein the semiconductor fin and each of the PD and PG devices are part of a static random access memory

(SRAM) cell having a β ratio that is about equal to one, the β ratio being defined as:

$$\beta=(Z_{PD}/L_{PD})/(Z_{PG}/L_{PG})$$

in which $Z_{PD}$ is the total perimeter of the PD device, $L_{PD}$ is an actual gate length of the PD device, $Z_{PG}$ is the total perimeter of the PG device, and $L_{PG}$ is an actual gate length of the PG device.

2. The semiconductor device according to claim 1, wherein an effective gate length of the PG device is greater than an effective gate length of the PD device after using a first dose of the second n-type dopant concentration tip region associated with the PG device in comparison to a second dose of the first n-type dopant concentration tip region associated with the PD device to increase static noise margin and read stability.

3. The semiconductor device according to claim 1, wherein the at least one multi-gate PD device is a tri-gate PD device, and wherein the at least one multi-gate PG device is a tri-gate PG device.

4. The semiconductor device according to claim 1, wherein the semiconductor fin and each of the PD and PG devices are part of a six-transistor cell, and wherein the six-transistor cell comprises two PD devices, two PG devices and two pull-up (PU) devices.

5. The semiconductor device according to claim 1, wherein an effective gate length of the PG device is greater than an effective gate length of the PD devices after using a reduced first energy of the second n-type dopant concentration tip region associated with the PG device in comparison to a second energy of the first n-type dopant concentration tip region associated with the PD device to increase static noise margin and read stability.

6. The semiconductor device according to claim 1, wherein the same dopant for the first and second dopant n-type concentration tip regions is arsenic (As).

7. The semiconductor device according to claim 5, wherein a dose of the first dopant concentration tip region associated with the PD device is about $1 \times 10^{13}$ cm$^{-2}$ to $1 \times 10^{16}$ cm$^{-2}$ and wherein the second energy of the first dopant concentration tip region is about 1 to 10 keV.

* * * * *